United States Patent
Zhang et al.

(10) Patent No.: US 10,972,083 B2
(45) Date of Patent: Apr. 6, 2021

(54) SUPPLY VOLTAGE DECOUPLING CIRCUITS FOR VOLTAGE DROOP MITIGATION

(71) Applicant: International Business Machines Corporation, Armonk, NY (US)

(72) Inventors: Xin Zhang, Yorktown Heights, NY (US); Todd Takken, Brewster, NY (US); Tianyu Jia, Evanston, IL (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 16/359,664

(22) Filed: Mar. 20, 2019

(65) Prior Publication Data

US 2020/0304112 A1 Sep. 24, 2020

(51) Int. Cl.
| | | |
|---|---|---|
| *H03K 5/02* | (2006.01) | |
| *H02H 1/00* | (2006.01) | |
| *H02M 3/07* | (2006.01) | |
| *G06F 1/324* | (2019.01) | |
| *G06F 1/32* | (2019.01) | |
| *G05F 1/575* | (2006.01) | |

(52) U.S. Cl.
CPC .............. *H03K 5/02* (2013.01); *H02H 1/0007* (2013.01); *G05F 1/575* (2013.01); *G06F 1/32* (2013.01); *G06F 1/324* (2013.01); *H02H 1/00* (2013.01); *H02M 3/07* (2013.01)

(58) Field of Classification Search
USPC ...................................................... 361/86–88
See application file for complete search history.

(56) References Cited

U.S. PATENT DOCUMENTS

| | | | |
|---|---|---|---|
| 6,538,497 B2 | 3/2003 | Thomas et al. | |
| 7,378,898 B2 | 5/2008 | Nair | |
| 7,812,664 B1 | 10/2010 | Duong | |
| 7,960,226 B2 | 6/2011 | Block et al. | |
| 10,019,048 B2 | 7/2018 | Chen | |
| 10,090,758 B1* | 10/2018 | Li | H02M 3/07 |
| 2016/0370837 A1* | 12/2016 | Shi | G06F 1/324 |

FOREIGN PATENT DOCUMENTS

WO 02/093340 A1 11/2002

\* cited by examiner

*Primary Examiner* — Danny Nguyen
(74) *Attorney, Agent, or Firm* — Daniel Morris; Ryan, Mason & Lewis, LLP

(57) ABSTRACT

Circuits and methods are provided for utilizing decoupling capacitors to mitigate voltage droop on power supply lines of a power distribution network. A power supply line is capacitively decoupled using a first decoupling capacitor connected to the power supply line and charged to a first voltage level of the power supply line. A second decoupling capacitor is pre-charged to a second voltage level greater than the first voltage level and held in standby. A control circuit determines or predicts an occurrence of a droop event in which the first voltage decreases to a level which is at or below a droop threshold voltage level, and selectively connects the pre-charged second decoupling capacitor to the power supply line to source additional boosting current through discharging of the second decoupling capacitor and thereby capacitively decouple the power supply line using the higher second voltage and additional boosting current.

20 Claims, 7 Drawing Sheets

100

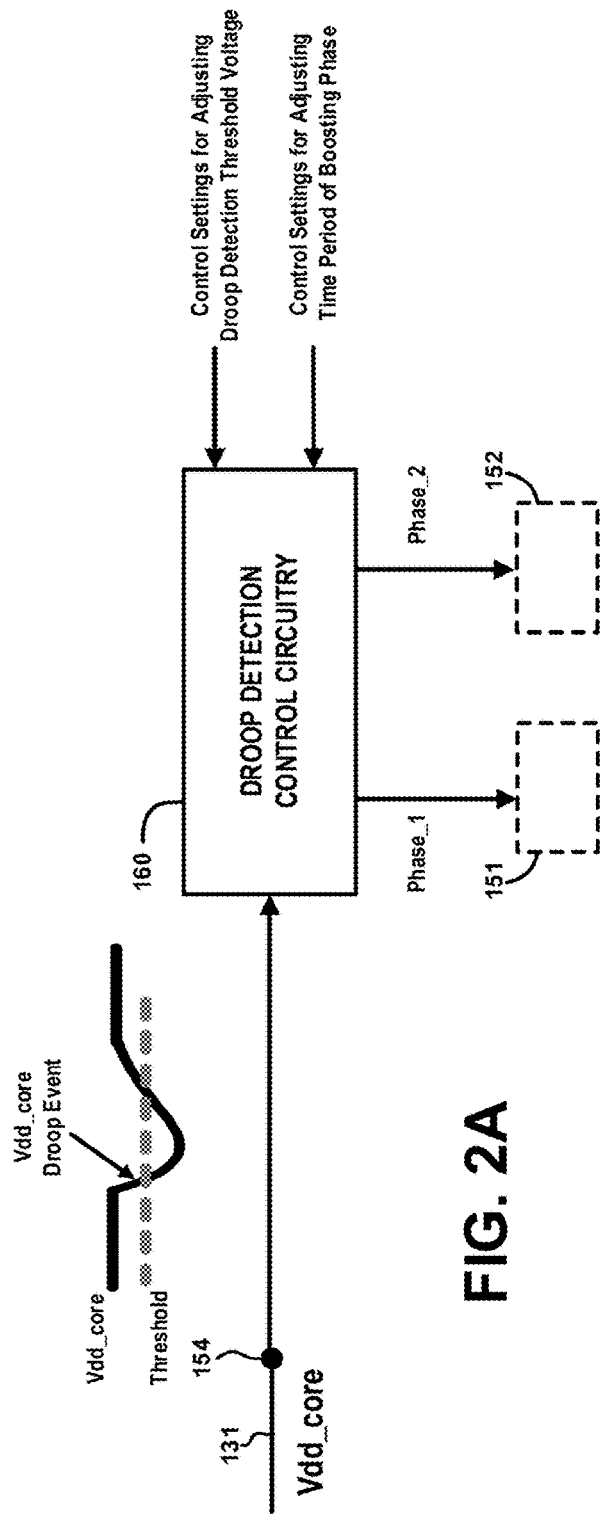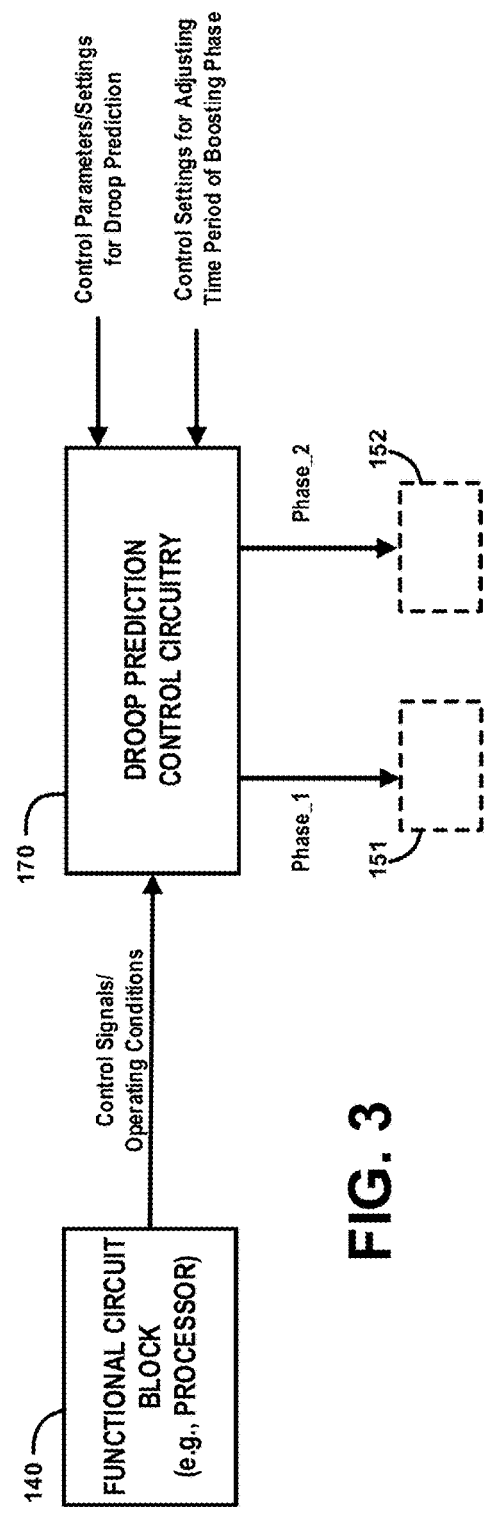

200

300

SUPPLY VOLTAGE DECOUPLING CIRCUITS FOR VOLTAGE DROOP MITIGATION

STATEMENT REGARDING FEDERALLY SPONSORED RESEARCH OR DEVELOPMENT

This invention was made with Government support under Contract No.: B621073 awarded by the Department of Energy. The Government has certain rights in this invention.

TECHNICAL FIELD

This disclosure relates generally to power distribution networks for delivering power supply voltage to integrated circuit devices and, in particular, to techniques for utilizing on-chip decoupling capacitors within a power distribution network to mitigate transient voltage drops on power supply lines of a power distribution network.

BACKGROUND

A power distribution network (PDN) of a semiconductor package structure is implemented to deliver regulated voltages to integrated circuit chips that are included in the semiconductor package structure. A PDN typically comprises elements such as an AC-to-DC converter that converts an AC voltage (e.g., 110 VAC) to a first DC voltage level, a voltage regulator module (VRM) that converts the first DC voltage level to a second DC voltage, a printed circuit board (PCB) which comprises various interconnects (e.g., traces, pads, vias, planes, etc.) to distribute DC power from the VRM to a chip package or chip substrate which is mounted to the PCB, wherein the chip package/substrate comprises various traces and solder balls or bond wires to deliver DC power to a semiconductor integrated circuit (IC) chip (i.e., IC die) mounted to the chip package/substrate, and an on-chip power grid that is formed as part of, e.g., a back-end-of-line structure, to deliver DC power to integrated circuitry formed as part of the front-end-of-line of the IC chip.

Shrinking device dimensions, faster switching frequencies, and increasing power consumption in state-of-the-art integrated circuit technologies cause large switching currents to flow in a PDN, which can lead to voltage drops across the network. Indeed, a PDN comprises a network of interconnects (e.g., traces, pads, vias, planes, package leads, solder arrays, bond wires, etc.) which introduce complex impedances within the PDN as a result of parasitic inductive, capacitive, and resistive components of the interconnects. A rapidly-changing current flowing through the complex impedances in a PDN can result in a voltage drop on power supply lines of the PDN, which is referred to as voltage supply droop or supply rail droop.

In this regard, to eliminate or reduce transient voltage drops on power supply lines of a PDN, a plurality of PCB-level and on-chip decoupling capacitors (or bypass capacitors) are typically connected between positive and negative power supply lines of the PDN to store electric charge and provide an additional source of current in response to rapid transient current demands of integrated circuits to minimize supply voltage droop. However, the transient current demands of integrated circuits can be significant and vary over time. As such, if a decoupling capacitor is unable to source enough charge to a given load in response to an increased transient current demand, supply voltage droop can occur, which can potentially cause excess voltage ripple, regulator instability, reduced timing margin, brownout, or functional circuit failure.

SUMMARY

Embodiments of the invention include supply voltage decoupling circuits and methods for utilizing decoupling capacitors to mitigate voltage droop on power supply lines of a power distribution network. For example, one exemplary embodiment includes a device which comprises a supply voltage decoupling circuit. The supply voltage decoupling circuit comprises: a first node configured for connection to a positive power supply line of a power distribution network, a second node configured for connection to a negative power supply line of the power distribution network, and a third node; a first decoupling capacitor connected between the first and second nodes, wherein the first decoupling capacitor is configured to be charged to a first voltage equal to a difference between voltages on the positive and negative power supply lines; and a second decoupling capacitor connected between the third node and the second node, wherein the second decoupling capacitor is configured to be charged to a second voltage which is greater than the first voltage. The supply voltage decoupling circuit is configured to operate in a pre-charge mode in which the third node is selectively connected to a voltage source to charge the second decoupling capacitor to the second voltage. The supply voltage decoupling circuit is configured to operate in a voltage boosting mode in which the third node is selectively connected to the first node to source boosting current to the positive power supply line through discharging of the second decoupling capacitor.

Another embodiment includes a method which comprises: capacitively decoupling a power supply line of a power distribution network using a first decoupling capacitor which is connected to the power supply line and charged to a first voltage level of the power supply line, to mitigate voltage droop on the power supply line when the first voltage level does not decrease to a level which is at or below a droop threshold voltage level; pre-charging a second decoupling capacitor to a second voltage level which is greater than the first voltage level; determining an occurrence of a droop event in which the first voltage level decreases to a level which is at or below a droop threshold voltage level; and selectively connecting the pre-charged second decoupling capacitor to the power supply line in response to determining the occurrence of the droop event, to thereby apply the second voltage level to the power supply line and source boosting current to the power supply line through discharging of the second decoupling capacitor.

Other embodiments will be described in the following detailed description of embodiments, which is to be read in conjunction with the accompanying figures.

BRIEF DESCRIPTION OF THE DRAWINGS

FIG. 2A schematically illustrates control circuitry which can be implemented to generate switch control signals for controlling voltage boosting and pre-charge phases of a supply voltage decoupling circuit, according to an exemplary embodiment of the invention.

FIG. 3 schematically illustrates control circuitry which can be implemented to generate switch control signals for controlling voltage boosting and pre-charge phases of a supply voltage decoupling circuit, according to another exemplary embodiment of the invention.

DETAILED DESCRIPTION OF EMBODIMENTS

Embodiments will now be described in further detail with regard to supply voltage decoupling circuits and methods for utilizing decoupling capacitors to mitigate voltage droop on power supply lines of a power distribution network. It is to be understood that the various circuits and structures shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

Figure 1:
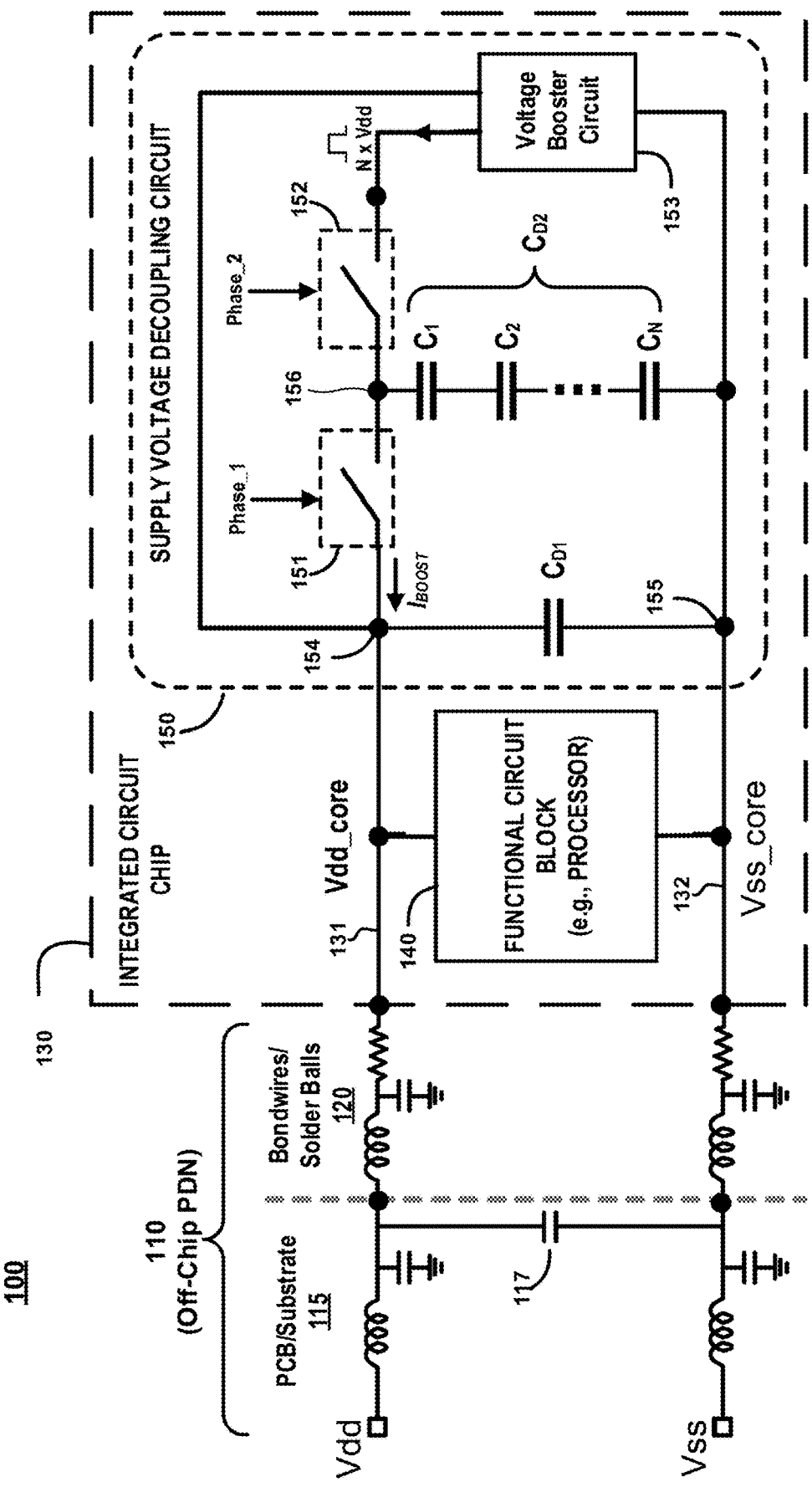
FIG. 1 schematically illustrates a semiconductor package structure comprising a power distribution network in which a supply voltage decoupling circuit is implemented to minimize supply voltage droop, according to an exemplary embodiment of the invention.

FIG. 1 schematically illustrates a semiconductor package structure 100 comprising a power distribution network in which a supply voltage decoupling circuit is implemented to minimize supply voltage droop, according to an exemplary embodiment of the invention. The package structure 100 comprises an off-chip power distribution network 110 that delivers positive power supply voltage (e.g., Vdd) and negative power supply voltage (e.g., Vss) to an integrated circuit chip 130 (e.g., die). The off-chip power distribution network 110 comprises various interconnects 115 (e.g., traces, pads, vias, planes, package leads, etc.) which are part of a printed circuit board (PCB) and/or chip package substrate, and an array of solder balls or bond wires 120 which are used to electrically connect the integrated circuit chip 130 to the terminals of a chip package or directly to a PCB substrate. The off-chip PDN 110 comprises complex impedances as a result of intrinsic parasitic inductive, capacitive, and resistive components (as schematically illustrated in FIG. 1 by inductor, capacitor, and resistor elements). A rapid switching of current through such complex impedances will generate a voltage drop (referred to as supply voltage droop) when the power supply is unable to supply the load with the required current, with the potential to cause excess ripple, regulator instability, reduced timing margin, brownout, or functional failure without proper capacitive decoupling. As schematically shown in FIG. 1, the off-chip PDN 110 comprises board-level decoupling using one or more decoupling capacitors 117 connected between the positive and negative power supply voltage lines Vdd and Vss.

As further shown in FIG. 1, the integrated circuit chip 130 comprises a functional circuit block 140 (e.g., a processor core) and a supply voltage decoupling circuit 150. The integrated circuit chip 130 comprises an on-chip power distribution network comprising a local positive power supply line 131 (alternatively referred to as Vdd_core power supply line) and a local negative power supply line 132 (alternatively referred to as Vss_core power supply line) to supply positive power supply voltage (Vdd) and negative power supply voltage (Vss), respectively, to the functional circuit block 140. The supply voltage decoupling circuit 150 comprises a first decoupling capacitor $C_{D1}$, a second decoupling capacitor $C_{D2}$, a first switch 151, a second switch 152, an on-chip voltage booster circuit 153, a first node 154 (or Vdd_core voltage node 154) coupled to the local positive power supply line 131, a second node 155 (or Vss_core voltage node 155) coupled to the local negative power supply line 132, and a third internal node 156 (or voltage boosting node 156).

The decoupling capacitor $C_{D1}$ is connected between the Vdd_core voltage node 154 and the Vss_core voltage node 155. The second decoupling capacitor $C_{D2}$ is connected between the voltage boosting node 156 and the Vss_core voltage node 155. The first switch 151 is controlled by a first switch control signal (Phase_1 control signal) and the second switch 152 is controlled by a second switch control signal (Phase_2 control signal). The voltage booster circuit 153 comprises a first input terminal connected to the Vdd_core voltage node 154 to receive as input the positive supply voltage Vdd, a second input terminal connected to the Vss_core voltage node 155 to receive as input the negative supply voltage Vss, and an output terminal connected to the second switch 152. The voltage booster circuit 153 is configured to boost the supply voltage Vdd (e.g., 1 V) to a higher voltage (N×Vdd) and output a voltage pulse of N×Vdd to pre-charge the second decoupling capacitor $C_{D2}$ during a pre-charge phase, as discussed in further detail below. For illustrative purposes, it is assumed that the negative supply voltage Vss is 0V (or ground) and the positive supply voltage Vdd can be any standard operating voltage, e.g., 5V, 3.3V, 2.5V. 1.8V, or lower, etc.

In the exemplary embodiment of FIG. 1, the supply voltage decoupling circuit 150 is configured to apply boosting voltage (and thus supply boosting current) to the Vdd_core voltage node 154 to prevent or mitigate voltage droop on the local positive power supply line 131 in circumstances where rapid switching events in the functional circuit block 140 result in large transient current demands which cannot be sufficiently supplied from, e.g., the first decoupling capacitor $C_{D1}$ or a remote voltage regulator module through the power distribution network. The first decoupling capacitor $C_{D1}$ is a fixed decoupling capacitor which is directly connected between the Vdd_core voltage node 154 and the Vss_core voltage node 155 and configured to source additional current to the functional circuit block 140 to prevent or mitigate voltage droop on the local positive power supply line 131. In this regard, the first decoupling capacitor $C_{D1}$ functions in the same manner as a conventional on-chip decoupling capacitor to mitigate voltage variations on the local positive power supply line 131. However, as in conventional decoupling capacitor designs, the capability of voltage droop mitigation depends on a total decoupling capacitance $C_{Decap}$. With high-integration densities that lead to increased chip area constraints for implementing decoupling capacitors, the total decoupling capacitance value $C_{Decap}$ for a fixed decoupling capacitor is typically relatively small such that the fixed decoupling capacitor cannot supply sufficient current to prevent large voltage droops on a voltage supply rail.

The second decoupling capacitor $C_{D2}$ is configured to apply a boosted voltage to the Vdd_core voltage node 154, and thus supply additional boosting current ($I_{Boost}$) to the Vdd_core voltage node 154, to prevent or mitigate voltage droop on the local positive power supply line 131 in circumstances where either (i) a large voltage droop is detected on the local positive power supply line 131 or (ii) a large voltage droop is predicted to occur on the local positive power supply line 131 based on anticipated or predicted operational modes of the functional circuit block 140, and thereby provide additional boosting current to satisfy large transient current demands of the functional circuit block 140. The second decoupling capacitor $C_{D2}$ is pre-charged to a voltage (N×Vdd) which is greater than the voltage (Vdd) on the local positive voltage supply line 131 during a "pre-charge phase" of the supply voltage decoupling circuit 150. More specifically, in a pre-charge phase, the first switch 151 is in a deactivated state by de-assertion of the Phase_1 control signal, and the second switch 152 is in an activated state by assertion of the Phase_2 control signal. As such, in the pre-charge phase, the second decoupling capacitor CD 2 is disconnected from the Vdd_core voltage node 154 and connected to the output of the voltage booster circuit 153 and pre-charged to a boosting voltage (N×Vdd) which is greater than the voltage Vdd on the local power supply line 131.

The second decoupling capacitor CD 2 is maintained in a pre-charged standby state where the voltage on the third node 156 is at a higher voltage level (N×Vdd) than the voltage (Vdd) on the Vdd_core voltage node 154. When a voltage droop is detected, or otherwise predicted to occur, on the local positive power supply line 131, a "voltage boosting phase" is initiated where the first switch 151 is activated by assertion of the Phase_1 control signal, and the second switch 152 is deactivated by de-assertion of the Phase_2 control signal. This switching event (for the voltage boosting phase) causes the third node 156 with the higher voltage (N v Vdd) to be selectively connected to the Vdd_core voltage node 154 and discharge the second decoupling capacitor $C_{D2}$ to provide the additional boosting current $I_{Boost}$ needed to satisfy the increased transient current demand of the functional circuit block 140 and mitigate transient voltage droop on the Vdd_core supply line 131. In this configuration, connecting the third node 156 with the higher voltage (N×Vdd) to the Vdd_core voltage node 154 (via activation of the first switch 151) prevents excessive discharge of the first decoupling capacitor $C_{D1}$, as a relatively significant amount of additional boosting current $I_{Boost}$ is provided by discharging the second decoupling capacitor $C_{D2}$.

After a period time in which voltage ripple settles on the Vdd_core supply line 131, the first switch 151 is deactivated by de-assertion of the Phase_1 control signal and the second switch 152 is activated by assertion of the Phase_2 control signal. This switching event serves to reconnect the second decoupling capacitor $C_{D2}$ to the output of the voltage booster circuit 154 and pre-charge the second decoupling capacitor $C_{D2}$ to the higher voltage (N×Vdd) and maintain the second decoupling capacitor $C_{D2}$ is a pre-charged standby mode for a next voltage boosting phase. The switch control signals Phase_1 and Phase_2 are generated by control circuitry, exemplary embodiments of which will be discussed in further detail below in conjunction with FIGS. 2A, 2B and 3.

While FIG. 1 illustrates one functional circuit block 140 and associated on-chip supply voltage decoupling circuit 150 for ease of illustration, it is to be understood that the semiconductor IC chip 130 can include a plurality of functional circuit blocks and a plurality of on-chip supply voltage decoupling circuits that are configured to prevent or mitigate voltage droop on local power supply lines connected to the functional circuit blocks in other regions of the semiconductor IC chip 130. In particular, a dedicated on-chip supply voltage decoupling circuit can be connected to the local power supply lines of any type of functional circuit block on the semiconductor IC chip 130 which requires increased transient current demand at certain periods of time or operational modes. In this regard, the functional circuit block 140 can be, for example, a processor core, bit-line pre-charging circuitry of a memory array, or any other types of functional circuit blocks that do not draw constant current, but rather have dynamically varying current demands with relatively large transient current demands for certain operational modes of such functional circuit blocks.

Moreover, while the exemplary embodiment of FIG. 1 schematically illustrates the functional circuit block 140 and all components of the supply voltage decoupling circuit 150 residing on a single semiconductor IC chip 130, it is to be understood that such components can reside on different semiconductor IC chips of the semiconductor package 100. For example, the functional circuit block 140 and the supply voltage decoupling circuit 150 can reside on the same semiconductor IC die, while the voltage booster circuit 153 resides on another semiconductor IC die. By way of further example, the functional circuit block 140 and the first decoupling capacitor Cm can reside on the same semiconductor IC die, while all other components of the supply voltage decoupling circuit 150 reside on another semiconductor IC die within the semiconductor package structure 100.

The voltage booster circuit 153 comprises a DC-to-DC power converter that steps up the supply voltage (Vdd) to a higher boosting voltage (N×Vdd). The voltage booster circuit 153 can be implemented using any suitable type of DC-to-DC step-up converter circuitry that steps up the voltage (while stepping down current) from the input terminal of the voltage booster circuit 153 to the output terminal of the voltage booster circuit 153. For example, in some embodiments, the voltage booster circuit 153 comprises charge pump circuitry (e.g., charge pump voltage converter) in which capacitors are used to boost the voltage. Further, in some embodiments, the first and second switches 151 and 152 are implemented using MOSFET devices, wherein the switch control signals Phase_1 and Phase_2 are applied to gate terminals of the MOSFET switch devices 151 and 152, respectively, wherein the source/drain terminals of the MOSFET switch device 151 are connected to the nodes 154 and 156, and wherein the source/drain terminals of the MOSFET switch device 152 are connected to the node 156 and the output terminal of the voltage booster circuit 153.

In the circuit configuration shown in FIG. 1, the first and second decoupling capacitors $C_{D1}$ and $C_{D2}$ are connected in parallel when the first switch 151 is activated and the second switch 152 is deactivated. In this switching configuration, the supply voltage decoupling circuit 150 provides a total decoupling capacitance, $C_{DT}$, which is determined as: $C_{DT}=C_{D1}+C_{D2}$. In some embodiments, the supply voltage decoupling circuit 150 is allocated a total fixed amount of chip footprint area to implement a decoupling capacitance $C_{Decap}$, wherein a portion of the total footprint area for $C_{Decap}$ is allocated to the first decoupling capacitor $C_{D1}$ and a remaining portion of the total footprint area for $C_{Decap}$ is allocated to the second decoupling capacitor $C_{D2}$. In other words, $C_{Decap}=XC_{D1}+yC_{D2}$, where "x" is a fractional value less than 1, and wherein y=(1−x). In some exemplary embodiments, x=y=0.5, such that both the first and second decoupling capacitors $C_{D1}$ and $C_{D2}$ are each allocated ½ of the total fixed amount of chip footprint area allocated for the decoupling capacitance $C_{Decap}$.

In some embodiments, the second decoupling capacitor $C_{D2}$ is implemented as a single capacitor which has a voltage rating that is sufficient to handle the pre-charge voltage level of N×Vdd, while the first decoupling capacitor $C_{D1}$ has a voltage rating sufficient to handle the core voltage level Vdd. In this instance, when the first and second decoupling capacitors $C_{D1}$ and $C_{D2}$ are selectively connected in parallel, the total decoupling capacitor $C_{DT}=C_{D1}+C_{D2}$ would be equal to the $C_{Decap}$ capacitance value.

In other embodiments, where the capacitors on the semiconductor integrated IC chip 130 are fabricated using the same materials and fabrication technology (with a maximum voltage rating sufficient to handle the core voltage level Vdd), the second decoupling capacitor $C_{D2}$ is implemented using two or more serially connected capacitors to effectively achieve a higher voltage rating for the second decoupling capacitor $C_{D2}$. For example, as schematically illustrated in FIG. 1, the second decoupling capacitor $C_{D2}$ comprises N serially connected capacitors $C_1, C_2, \ldots, C_N$, wherein it is assumed that each of the N serially connected capacitors $C_1, C_2, \ldots, C_N$ has a voltage rating of Vdd such that the N serially connected capacitors $C_1, C_2, \ldots, C_N$ effectively form the second decoupling capacitor $C_{D2}$ with a voltage rating sufficient to handle the pre-charge boosting voltage N×Vdd that is applied to the third node 156. In other words, assuming that the only available capacitors on the semiconductor IC chip 130 are rated at the voltage level of Vdd (e.g., 1V), and are all of identical capacitance values, in which instance, by connecting at least N of such capacitors in series, the higher voltage pre-charge voltage (N×Vdd) would be divided across all the N capacitors and the maximum voltage rating (e.g., Vdd) would not be exceeded.

When the second decoupling capacitor $C_{D2}$ comprises N serially connected capacitors $C_1, C_2, \ldots, C_N$, the fraction of the total footprint area of the decoupling capacitance $C_{Decap}$ allocated to the second decoupling capacitor $C_{D2}$ is divided into N capacitors $C_1$ through $C_N$, which are connected in series to handle the higher voltage of N×Vdd across $C_{D2}$ capacitor stack. In one exemplary embodiment, assuming that each capacitor $C_1$ through $C_N$ has the same capacitance value C, and that $C_{D2}$ is allocated 50% (or ½) of the total footprint area of the decoupling capacitor $C_{Decap}$, the capacitance value C of each capacitor $C_1$ through $C_N$ would be computed as:

$$C = \frac{C_{D2}}{N} = \frac{C_{Decap}}{2N}.$$

In this exemplary embodiment, the effective capacitance value of $C_{D2}$ formed by the stack of N serially connected capacitors would be:

$$C_{D2} = \frac{1}{\frac{1}{C_1}+\frac{1}{C_2}+\cdots\frac{1}{C_N}} = \frac{C_{Decap}}{2N^2} = \frac{C}{N}$$

wherein the effective capacitance value of $C_{D2}$ would be less than ½ the capacitance value of $C_{Decap}$.

The decoupling capacitors $C_{D1}$ and $C_{D2}$ can be implemented using one or more of various types of capacitor device structures. For example, the decoupling capacitors $C_{D1}$ and $C_{D2}$ can be implemented as metal-insulator-metal (MIM) capacitors. In general, MIM capacitors typically are comprised of two metallic plates separated by an insulator layer, wherein the capacitance of an MIM capacitor is (i) directly proportional to a surface area of the overlapping metallic plates, (ii) directly proportional to a dielectric constant of the dielectric material of the capacitor insulator layer, and (iii) inversely proportional to a thickness of the capacitor insulator layer. In other embodiments, the decoupling capacitors $C_{D1}$ and $C_{D2}$ can be implemented using MOSFET devices, wherein a MOSFET device can be configured as a capacitor structure by commonly connecting the source, drain, and bulk regions, and using the gate region as a first terminal of the MOS capacitor and using the commonly connected source/drain/bulk regions as a second terminal of the MOS capacitor. The decoupling capacitors $C_{D1}$ and $C_{D2}$ can be implemented using other types of capacitor device structures as is known in the art.

Figure 2B:
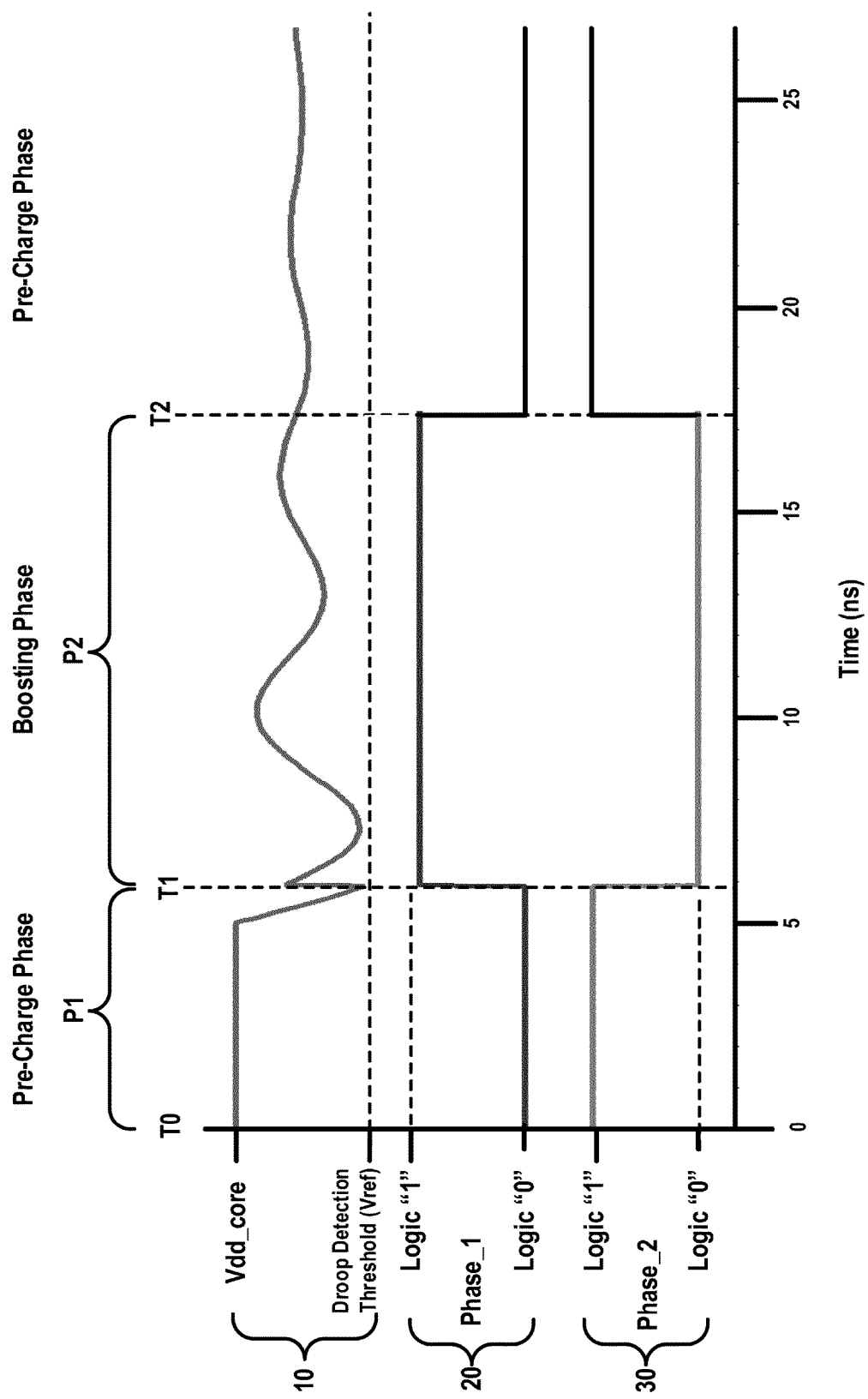
FIG. 2B is a timing diagram which depicts exemplary supply voltage and switch control signal waveforms that illustrate a mode of operation of the control circuitry of FIG. 2A, according to an exemplary embodiment of the invention.

The switch control signals Phase_1 and Phase_2 shown in FIG. 1 are generated using various types of control circuitry and control techniques, exemplary embodiments of which will now be discussed in further detail in conjunction with FIGS. 2A and 2B and FIG. 3. In particular, FIG. 2A schematically illustrates control circuitry which can be implemented to generate switch control signals for controlling voltage boosting and pre-charge phases of a supply voltage decoupling circuit, according to an exemplary embodiment of the invention. In particular, FIG. 2A schematically illustrates droop detection control circuitry 160 which can be implemented to generate the switch control signals Phase_1 and Phase_2 for controlling the first and second switches 151 and 152 of the supply voltage decoupling circuit 150, according to an exemplary embodiment of the invention. As schematically illustrated in FIG. 2A, the droop detection control circuitry 160 comprises an input connected to the Vdd_core voltage node 154 and is configured to monitor the voltage level on the local positive power supply line 131 to detect for the occurrence of a "droop event" where the Vdd voltage level on the local positive power supply line 131 decreases to a droop detection threshold voltage level. For example, in an exemplary embodiment where the supply voltage level Vdd is 1 volt, the droop detection threshold voltage level can be 0.98 volts (a decrease of 20 mV).

In response to detection of a droop event, the droop detection control circuitry 160 generates and outputs the switch control signals Phase_1 and Phase_2 at the proper logic levels to activate the first switch 151 and deactivate the second switch 152, and thereby cause the voltage boosting node 156 with the higher voltage (N×Vdd) to be selectively connected to the Vdd_core voltage node 154 and discharge the second decoupling capacitor $C_{D2}$ to provide the additional boosting current that serves to mitigate the transient voltage droop on the Vdd_core supply line 131. An exemplary mode of operation of the droop detection control circuitry 160 will be discussed in further detail below in conjunction with the waveform timing diagrams of FIG. 2B.

The droop detection control circuitry 160 can be implemented using various types of functional circuits that are suitable to perform the droop detection and switch control functions as discussed herein. For example, the droop detection control circuitry 160 may comprise a 2-input (Vin and Vref) comparator circuit (e.g., operational amplifier) that is configured to compare the voltage level on the Vdd_core supply line 131 (Vin) with a droop detection threshold voltage level (Vref) and (i) output a logic 1 control signal when the supply voltage level on the Vdd_core supply line 131 is larger than the reference threshold voltage and (ii) output a logic 0 control signal when the supply voltage level on the Vdd_core supply line 131 reaches or falls below the reference voltage.

In some embodiments, the droop detection threshold voltage (Vref) can be generated using a reference voltage generator circuit such as voltage divider circuit connected between Vdd and Vss supply voltage lines that feed supply power to the droop detection control circuitry 160. In some embodiments, the droop detection control circuitry 160 comprises a programmable droop detection threshold voltage (Vref) which can be programmatically adjusted by external control settings that are input to the droop detection control circuitry 160. For example, in some embodiments, a voltage divider circuit for generating the droop detection threshold voltage (Vref) may have a variable resistance element that can be adjusted through programmatic control to adjust the droop detection threshold voltage level that is applied to the Vref terminal of the comparator circuit.

The droop detection control circuitry 160 further comprises switch control circuitry that is configured to generate (assert/de-assert) the switch control signals Phase_1 and Phase_2 based on the logic level of the control signal output from the comparator circuit. In some embodiments, the switch control circuitry comprises timer/counter circuitry that is configured to be triggered upon the detection of a droop event and maintain the supply voltage decoupling circuit 150 in the voltage boosting phase for a predetermined time period (following the detected droop event) which is sufficient to achieve a steady state (e.g., settled voltage ripple) on the Vdd_core supply line 131. In some embodiments, the duration of the voltage boosting phase is fixed based on a priori knowledge of the type of functional circuit and the transient response time, e.g., $\tau = R \times C$ (e.g., cut-off frequency) of the fixed decoupling capacitor $C_{D1}$. In some embodiments, the timer/counter circuitry of the droop detection control circuitry 160 can be programmed by control settings that are input to the droop detection control circuitry 160 to adjust the duration of the voltage boosting phase.

FIG. 2B is a timing diagram which depicts exemplary supply voltage and switch control signal waveforms that illustrate a mode of operation of the droop detection control circuitry 160 of FIG. 2A, according to an exemplary embodiment of the invention. In particular, FIG. 2B depicts a supply voltage waveform 10, which represents a voltage level on the Vdd_core supply line 131 over a given period of time, and a first switch control signal waveform 20 and second switch control signal waveform 30, which represent the Phase_1 and Phase_2 switch control signals, respectively, that are generated by the droop detection control circuitry 160 over the given period of time. As shown in FIG. 2B, over a time period P1 from $T_0$ and $T_1$ (pre-charge phase), the supply voltage waveform 30 for Vdd_core is detected to have a voltage level that is greater than a droop detection threshold voltage level (Vref). As such, during the time period P1 (pre-charge period), the Phase_1 switch control signal 20 is de-asserted (e.g., Logic 0) and the Phase_2 switch control signal 30 is asserted (e.g., Logic 1), which causes the first switch 151 to be in a deactivated state and the second switch 152 to be in an activated state, whereby the second decoupling capacitor $C_{D2}$ is pre-charged to the higher voltage domain (N×Vdd) and is in a standby state.

As further shown in FIG. 2B, at time T1, the droop detection control circuitry 160 detects the occurrence of a "droop event" where the voltage level on the Vdd_core supply line 131 drops to at or below the droop detection threshold voltage level (Vref). In response to the droop event detected at time T1, the Phase_1 switch control signal 20 is asserted (e.g., Logic 1) and the Phase_2 switch control signal 30 is de-asserted (e.g., Logic 0), which causes the first switch 151 to be activated and the second switch 152 to be deactivated. As noted above, this switching event at time T1 causes the second decoupling capacitor $C_{D2}$ to be disconnected from the voltage booster circuit 153 and connected to the Vdd_core supply line 131 to provide the additional boosting current $I_{Boost}$ needed to source the increased transient current demand of the functional circuit block 140 and mitigate the transient voltage droop on the Vdd_core supply line 131.

For a given time period P2 from T1 to T2 (voltage boosting phase), the second decoupling capacitor $C_{D2}$ remains connected to the Vdd_core supply line 131 to supply a sufficient amount of current to counteract the increased transient current draw and allow the voltage ripple of Vdd on the Vdd_core supply line 131 to settle, as illustrated in FIG. 2B. At time T2, the Phase_1 switch control signal 20 is de-asserted (e.g., Logic 0) and the Phase_2 switch control signal 30 is asserted (e.g., Logic 1), which causes the first switch 151 to be de-activated and the second switch 152 to be activated. This switching event at time T2 causes the second decoupling capacitor $C_{D2}$ to be disconnected from the Vdd_core supply line 131 and reconnected to the output of the voltage booster circuit 153 and initiate a next pre-charge phase to charge the second decoupling capacitor $C_{D2}$ back up to the boosting voltage level of N×Vdd.

The duration of the voltage boosting phase (e.g., period P2) is set to time which is sufficient for the second decoupling capacitor $C_{D2}$ to provide enough additional charge (e.g., boosting current) to prevent excessive voltage droop on the Vdd_core supply line and excessive discharge of the first decoupling capacitor $C_{D1}$. For example, as noted above, in some embodiments, the duration of the voltage boosting phase can be either (i) fixed by design based on a priori knowledge, or (ii) field-programmable wherein the duration of the voltage boosting phase can be programmatically adjusted based on empirical knowledge obtained during real-time operation. The duration of the voltage boosting phase is based, in part, on the transient response time, e.g., $\tau = R \times C$ (or cut-off frequency) of the first decoupling capacitor $C_{D1}$ which can limit the ability of the decoupling capacitor $C_{D1}$ to supply the proper charge in response to the rapid switching of current and increased transient current demands of a functional circuit block. In this regard, the time duration of the voltage boosting phase can be set to some multiple (e.g., 2× or more) of the transient response time $\tau$ of the first decoupling capacitor $C_{D1}$ to ensure settling of the voltage ripple on the Vdd_core supply line 131.

Furthermore, in other embodiments, the duration of the voltage boosting phase is dynamically determined based on the monitoring of the voltage ripple on the Vdd_core supply line 131 during the voltage boosting phase. With such dynamic monitoring, the droop detection control circuitry 160 can include voltage ripple sensing circuitry to detect the peak-to-peak ripple voltage on the Vdd_core supply line 131 during a voltage boosting phase, and control the activation/deactivation of the switches 151 and 152 of the supply voltage decoupling circuit 150 to enter into a pre-charge phase when the peak-to-peak ripple voltage is detected to be less than a predefined peak-to-peak ripple voltage threshold value.

FIG. 3 schematically illustrates control circuitry which can be implemented to generate switch control signals for controlling voltage boosting and pre-charge phases of a supply voltage decoupling circuit, according to another exemplary embodiment of the invention. In particular, FIG. 3 schematically illustrates droop prediction control circuitry 170 which can be implemented to generate the Phase_1 and Phase_2 switch control signals for controlling the first and second switches 151 and 152 of the supply voltage decoupling circuit 150, according to an exemplary embodiment of the invention. As schematically illustrated in FIG. 3, the droop prediction control circuitry 170 interfaces with the functional circuit block 140 and/or other control circuitry to receive various types of information such as (i) control/notification signals from the functional circuit block 140 and/or other control circuitry and/or (ii) detected operating conditions of the functional circuit block 140, etc., which are utilized by the droop prediction control circuitry 170 to anticipate voltage droop on the Vdd_core supply line 131 and decide when to initiate a voltage boosting phase to counteract the anticipated voltage droop on the Vdd_core supply line 131.

For example, when functional circuit block 140 is expected to initiate an operating mode that requires high-power or otherwise requires an increase in current draw from the power supply lines, the functional circuit block 140 (or other control circuit) can generate an alert or notification signal to the droop prediction control circuitry 170 which alerts the droop prediction control circuitry 170 that a given operation will be performed which may lead to a possible droop event on the Vdd_core supply line 131. In such instances, to protect against excessive supply voltage droop, the droop prediction control circuitry 170 can generate and output the Phase_1 and Phase_2 switch control signals at the proper logic levels to activate the first switch 151 and deactivate the second switch 152, and thereby cause the supply voltage decoupling circuit 150 to switch to a voltage boosting phase and thereby allow the second decoupling capacitor CD 2 to be discharged and provide the additional boosting current needed to prevent or minimize a potential transient voltage droop on the Vdd_core supply line 131.

In some embodiments, as schematically illustrated in FIG. 3, the droop prediction control circuitry 170 is field-programmable though the input of various control parameters or settings that are used to configure the droop control circuitry 170 to be able to process or analyze the (i) control/notification signals from the functional circuit block 140 and/or other control circuitry and/or the (ii) detected operating conditions of the functional circuit block 140, and thereby predict or otherwise anticipate potential droop events. In addition, similar to the droop detection control circuitry 160 discussed above, the droop prediction control circuitry 170 comprises switch control circuitry that is configured to generate (assert/de-assert) the Phase_1 and Phase_2 switch control signals to cause the supply voltage decoupling circuit to initiate voltage boosting operations in response to predicted droop events, and initiate pre-charging operations following the voltage boosting operations.

In some embodiments, the switch control circuitry of the droop prediction control circuitry 170 comprises timer/counter circuitry that is configured to be triggered upon the initiation of a voltage boosting operation and maintain the supply voltage decoupling circuit 150 in the voltage boosting phase for a predetermined duration (following the predicted or anticipated droop event) to ensure sufficient voltage droop mitigation. Further, in some embodiments, the timer/counter circuitry of the droop prediction control circuitry 170 can be programmed by control settings that are input to the droop prediction control circuitry 170 to adjust the duration of the voltage boosting phase.

In some embodiments, the control circuitry (e.g., droop detection control circuitry 160, droop prediction control circuitry 170, etc.) for the supply voltage decoupling circuit 150 is implemented on the semiconductor IC chip 130 as an integral component of the supply voltage decoupling circuit 150. In other embodiments, the control circuitry can reside on another chip which is packaged together with the semiconductor IC chip 130. It is to be understood that while the exemplary embodiments of the droop detection control circuitry 160 and the droop prediction control circuitry 170 are discussed above in the context of the supply voltage decoupling circuit 150 of FIG. 1, the same or similar control techniques can be implemented for other exemplary embodiments of supply voltage decoupling circuitry as will be discussed below in conjunction with FIGS. 5, 6, and 7.

As noted above, a fundamental operating principle of the supply voltage decoupling circuit 150 of FIG. 1 is that a base decoupling capacitance (e.g., first decoupling capacitor $C_{D1}$) is connected to a first voltage domain (e.g., Vdd_core supply line 131) and is charged to a first voltage (e.g., Vdd), and a voltage boosting decoupling capacitance (e.g., second decoupling capacitor $C_{D1}$) is connected to a second voltage domain (voltage boosting node 156) and is charged to a second voltage (e.g., N×Vdd) which is higher than the first voltage (e.g., Vdd). During normal operation, the first decoupling capacitor $C_{D1}$ serves as a standard decoupling capacitor which sources additional current to the functional circuit block 140 in circumstances where increased transient current demands of the functional circuit block 140 do not actually result, or are not anticipated to result, in an excessive voltage droop on the Vdd_core supply line 131 (e.g., the voltage droop is minimal and does not exceed the droop detection threshold). In these circumstances, the first decoupling capacitor $C_{D1}$ (which is charged to Vdd) can be minimally discharged to provide the additional charge needed to satisfy the increased transient current draw on the Vdd_core supply line 131.

On the other hand, in circumstances where increased transient current demands of the functional circuit block 140 actually result in, or are anticipated to result in, excessive voltage droop on the Vdd_core supply line 131 (e.g., the voltage droop exceeds the droop detection threshold), the internal voltage boosting node 156 (which is pre-charged to a boosting voltage higher than Vdd) is temporarily connected to the Vdd_core supply node 154 to boost the voltage on the Vdd_core supply line 131 and discharge the second decoupling capacitor $C_{D2}$ to source the additional boosting current $I_{Boost}$ needed to satisfy the increased transient current demand of the functional circuit block 140 and prevent excessive transient voltage droop on the Vdd_core supply line 131. In this configuration, the second decoupling capacitor $C_{D2}$ is hard discharged to source out a larger fraction of the stored charge of the second decoupling capacitor $C_{D2}$ as compared to the minimal discharge of the first decoupling capacitor $C_{D1}$ so that the first decoupling capacitor $C_{D1}$ has sufficient charge to source current and provide sufficient capacitive decoupling of the Vdd_core supply line 131 after the operating mode of the supply voltage decoupling circuit 150 is switched from the voltage boosting phase to the pre-charge phase.

In a conventional decoupling capacitor design, the total amount of charge Q that is provided (i.e., sourced) by a decoupling capacitor $C_{Decap}$ is computed as:

$$Q_{sourced} = C_{Decap} \cdot \Delta V_{Droop}$$

where $\Delta V_{Droop}$ denotes the amount of decrease in voltage on the power supply line. On the other hand, with the supply voltage decoupling circuit 150 of FIG. 1, the total amount of charge Q that is provided (i.e., sourced) by the first and second decoupling capacitors $C_{D1}$ and $C_{D2}$ during a voltage boosting phase is computed as: $Q_{Total\_Sourced} = Q_{C_{D1}} + Q_{C_{D2}}$. More specifically, by way of example, assuming a total decoupling capacitance $C_{Decap}$ is apportioned equally to the first and second decoupling capacitors $C_{D1}$ and $C_{D2}$ such that $C_{D1} = C_{D2} = 0.5\ C_{Decap}$, and assuming that the second decoupling capacitor $C_{D2}$ comprises a plurality N of serially connected capacitors which all have the same capacitance, the total amount of charge Q that is provided (i.e., sourced) by the first and second decoupling capacitors $C_{D1}$ and $C_{D2}$ is computed as:

$$Q_{Total\_Sourced} = 0.5 \cdot C_{Decap} \cdot \Delta V_{Droop} + \left[\left(\frac{0.5 \cdot C_{Decap}}{N^2}\right) \cdot ((N-1) \cdot V_{dd} + \Delta V_{Droop})\right] \quad \text{(Equ. 1)}$$

where the charge Q sourced by the first decoupling capacitor $C_{D1}$ is:

$$Q_{C_{D1}} = 0.5 \cdot C_{Decap} \cdot \Delta V_{Droop},$$

and where the charge Q sourced by the second decoupling capacitor $C_{D2}$ is:

$$Q_{C_{D2}} = \left[\left(\frac{0.5 \cdot C_{Decap}}{N^2}\right) \cdot ((N-1) \cdot V_{dd} + \Delta V_{Droop})\right].$$

Figure 4:
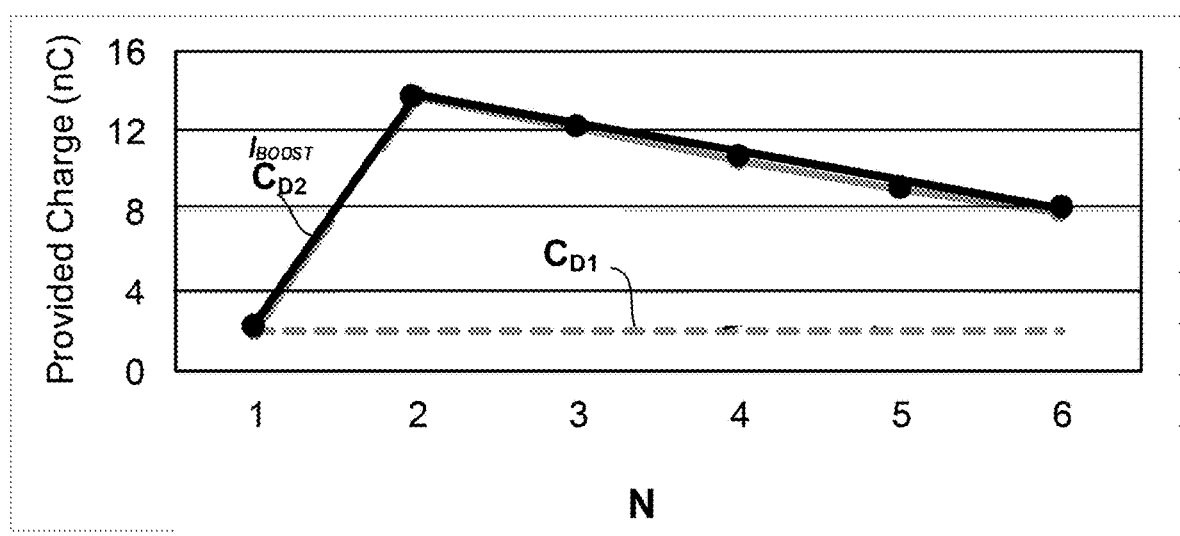
FIG. 4 graphically illustrates charge provided by first and second decoupling capacitors during a voltage boosting phase of a supply voltage decoupling circuit as a function of a number N of capacitors that form the second decoupling capacitor, according to an exemplary embodiment of the invention.

FIG. 4 graphically illustrates charge Q provided by the first and second decoupling capacitors $C_{D1}$ and $C_{D2}$ as a function of a number N of capacitors that form the second decoupling capacitor $C_{D2}$ during a voltage boosting phase of the supply voltage decoupling circuit 150, according to an exemplary embodiment of the invention. In particular, FIG. 4 graphically illustrates simulation results of provided charge in nanocoulombs (nC) based on the above Eqn. 1. FIG. 4 illustrates that a configuration of the decoupling capacitor $C_{D2}$ comprising N=2 serially connected capacitors provides a maximum boosting charge (e.g., $I_{Boost}$) to counteract voltage droop. Additional simulation results have shown that that with an increase in N, the peak boost current becomes larger, while the actual compensation charge becomes less as a result of a much smaller capacitance. Further simulation results have shown that as compared to a conventional scheme with a single fixed decoupling capacitor, the supply voltage decoupling schemes as described herein which implement a voltage boosting decoupling capacitor in addition to a fixed decoupling capacitor according to exemplary embodiments of the invention, can provide a significant reduction in the magnitude of voltage droop (e.g., at least 26% reduction), while maintaining the same total decoupling capacitance.

The following examples illustrate advantages that are realized using capacitive decoupling techniques as discussed herein. In one example, assume the following: (i) Vdd=1.0V; (ii) Vss=0V; (iii) the capacitance value of $C_{Decap}$=2 uF; (iv) 50% of the capacitance value of $C_{Decap}$ is allocated to $C_{D1}$ and $C_{D2}$ such that $C_{D1}=C_{D2}=1.0$ uF; and (v) N=2 such that $C_{D2}$ is comprised of two serially connected capacitors C1 and C2 with the same capacitance values C1=C2=0.5 uF wherein the total capacitance value of $C_{D2}$=0.25 uF. In this example, $C_{D1}$=1.0 uF and is charged to 1.0V, while $C_{D2}$=0.25 uF and is pre-charged to 2.0V. The benefit of this configuration is that a much larger fraction of the energy in the capacitor stack $C_{D2}$ is used to source boosting current before the voltage across the second decoupling $C_{D2}$ falls below the minimum allowed voltage level. Only a small fraction of the energy in the first decoupling capacitor $C_{D1}$ is provided to the functional circuit block 140 before the voltage across $C_{D1}$ falls below the minimum allowed voltage level.

By way of specific example, assuming a nominal Vdd=1.0 V and a minimum allowed voltage level is 0.9×Vdd=0.9 V, consider the following two cases:

Case 1: $C_{Decap}$ is allocated 100% to $C_{D1}$=2.0 uF. The starting voltage on $C_{D1}$=1.0 V, and the starting energy of $C_{D1}$ ($E_{start}$)=0.5$C_{Decap}$×Vdd$^2$The ending voltage on $C_{D1}$=0.9V, and the ending energy of $C_{D1}$ ($E_{Finish}$)=0.5 $C_{Decap}$×(0.9 Vdd)$^2$=0.81 ($E_{start}$). In this example, the chip area allocated to $C_{Decap}$ provides a boosting charge of 0.19×$E_{start}$=0.19×(0.5$C_{Decap}$×Vdd$^2$) to mitigate the voltage droop.

Case 2: $C_{Decap}$ is allocated 50% to $C_{D1}$ and 50% to $C_{D2}$, where $C_{D2}$ is divided into two capacitors C1 and C2 of the same capacitance value. If $C_{Decap}$=2 uF, then $C_{D1}$=1 uF and C1=C2=0.5 uF. The starting voltage on $C_{D1}$=1.0 V, and the starting energy of $C_{D1}$ ($E_{Start}$)=0.5×(0.5$C_{Decap}$×Vdd$^2$). The ending voltage on $C_{D1}$=0.9 V, and the ending energy of $C_{D1}$ ($E_{Finish1}$)=0.5×0.5$C_{Decap}$×(0.9>Vdd)$^2$=0.81×(0.5×(0.5 $C_{Decap}$×Vdd$^2$)). The starting voltage on $C_{D2}$=2.0 V, and the staring energy on $C_{D2}$ ($E_{Start2}$)=0.5×(0.5$C_{Decap}$/(N$^2$))×(N× Vdd)$^2$=0.5×(0.5$C_{Decap}$×Vdd$^2$). The ending voltage on $C_{D2}$=0.9 V, and the ending energy of $C_{D2}$ ($E_{Finish2}$)=0.5× (0.5$C_{Decap}$/(N$^2$))×(0.9×Vdd)$^2$=0.5×((0.9×0.9)/(N$^2$))× (0.5$C_{Decap}$×Vdd$^2$)=0.5×[0.81/N$^2$]×(0.5$C_{Decap}$×Vdd$^2$).

In this example, the chip area allocated to $C_{D1}$ of $C_{Decap}$ provides a boosting energy of [0.5+0.5−0.81−0.81/(N$_2$)]× (0.5$C_{Decap}$×Vdd$^2$) to mitigate the voltage droop, and the chip area allocated to $C_{D2}$ of $C_{Decap}$ provides a bosting energy of (1−0.81(1−1/(N$^2$)))×(0.5$C_{Decap}$×Vdd$^2$) to mitigate the voltage droop. For N=2, the energy provided is =(1− 0.81(1−¼))×(0.5$C_{Decap}$×Vdd$^2$)=0.3925×(0.5$C_{Decap}$× Vdd$^2$). Therefore, as demonstrated above, using a single decoupling capacitor $C_{D1}$ allocated fully to $C_{Decap}$, only 19% of the energy is available to mitigate voltage droop, whereas using the decoupling capacitors $C_{D1}$ and $C_{D2}$ with a boosted voltage on $C_{D2}$ where $C_{D1}$=$C_{D2}$=$C_{Decap}$/2, and N=2, a total of 39% of the energy is available, thereby providing enhanced voltage boosting functionality and droop mitigation.

Figure 5:
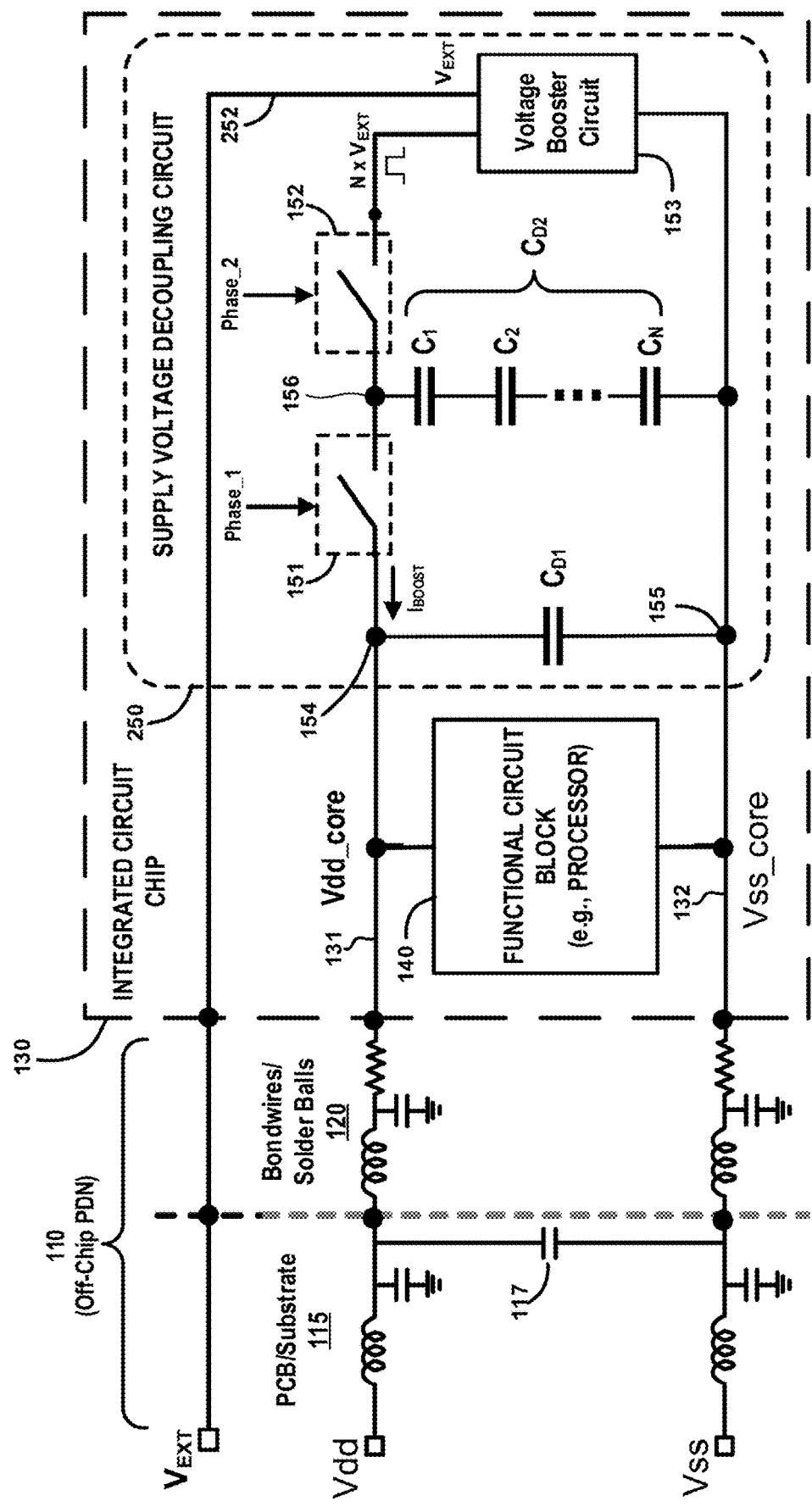
FIG. 5 schematically illustrates a semiconductor package structure comprising a power distribution network in which a supply voltage decoupling circuit is implemented to minimize supply voltage droop, according to another exemplary embodiment of the invention.

FIG. 5 schematically illustrates a semiconductor package structure 200 comprising a power distribution network in which a supply voltage decoupling circuit is implemented to minimize supply voltage droop, according to another exemplary embodiment of the invention. The semiconductor package structure 200 is similar in design and function to the semiconductor package structure 100 of FIG. 1 except that the semiconductor package structure 200 comprises a supply voltage decoupling circuit 250 where an input terminal of the voltage booster circuit 153 is connected to an external voltage line 252 to receive an external voltage $V_{EXT}$ and generate a boosted voltage $N \times V_{EXT}$. This embodiment provides an alternative embodiment to the supply voltage decoupling circuit 150 of FIG. 1 where the input terminal of the voltage booster circuit 153 is connected to the internal Vdd_core voltage node 154.

The embodiment of FIG. 5 allows the use of an external power source to supply an external voltage $V_{EXT}$ which is equal to Vdd or greater than Vdd for the purpose of increasing the droop mitigation functionality and minimizing the load on the Vdd_core supply line 131 by eliminating the connection of the input terminal of the voltage booster circuit 153 to the Vdd_core voltage node 154. Indeed, the higher external voltage Vext is advantageous in circumstances where, for example, there is a higher frequency of switching between the voltage boosting and pre-charge phases as a result of higher frequency of increased transient current demands of the functional circuit block 140, wherein the higher external voltage Vext (i.e., greater than Vdd) allows for more rapid pre-charging of the second decoupling capacitor $C_{D2}$ by the voltage booster circuit 153.

Figure 6:
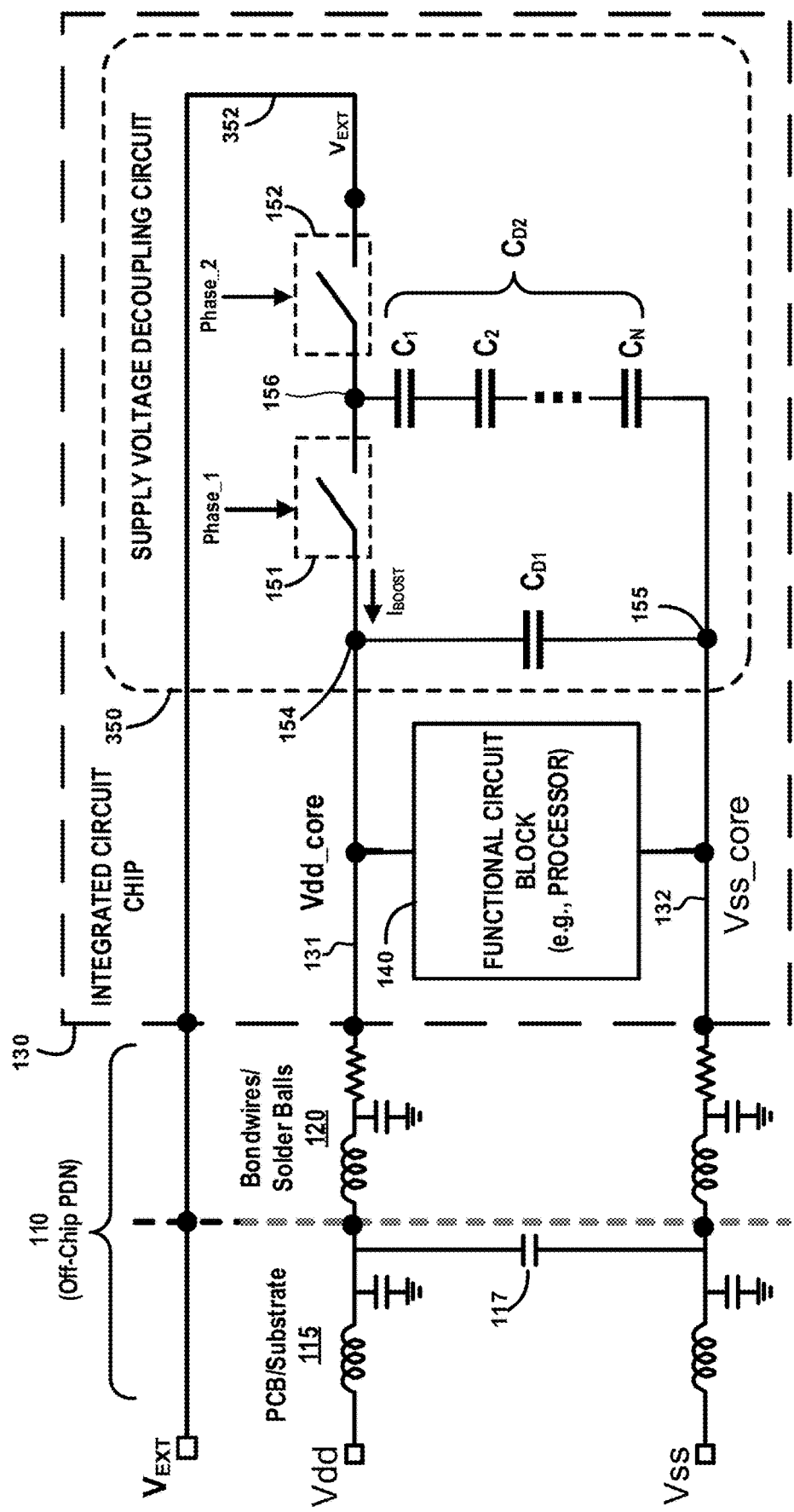
FIG. 6 schematically illustrates a semiconductor package structure comprising a power distribution network in which a supply voltage decoupling circuit is implemented to minimize supply voltage droop, according to yet another exemplary embodiment of the invention.

FIG. 6 schematically illustrates a semiconductor package structure 300 comprising a power distribution network in which a supply voltage decoupling circuit is implemented to minimize supply voltage droop, according to yet another exemplary embodiment of the invention. The semiconductor package structure 300 is similar in design and function to the semiconductor package structures 100 and 200 of FIGS. 1 and 5 except that the semiconductor package structure 300 comprises a supply voltage decoupling circuit 350 which eliminates the use of an on-chip voltage booster circuit 153 and wherein an external voltage line 352 is directly connected to a terminal of the second switch 152 to selectively connect an external voltage $V_{EXT}$ to the internal voltage boosting node 156 to charge the second decoupling capacitor $C_{D2}$ during pre-charge phases of the supply voltage decoupling circuit 350. As with the exemplary embodiment of FIG. 5, the embodiment of FIG. 6 provides an alternative embodiment of the supply voltage decoupling circuit 150 of FIG. 1 where an external power source is utilized to supply an external voltage $V_{EXT}$ (which is greater than Vdd) to the supply voltage decoupling circuit 350, for the purpose of increasing the droop mitigation functionality. Moreover, the elimination of the on-chip voltage booster circuit 153 decreases the complexity and footprint of the supply voltage decoupling circuit 350.

Figure 7:
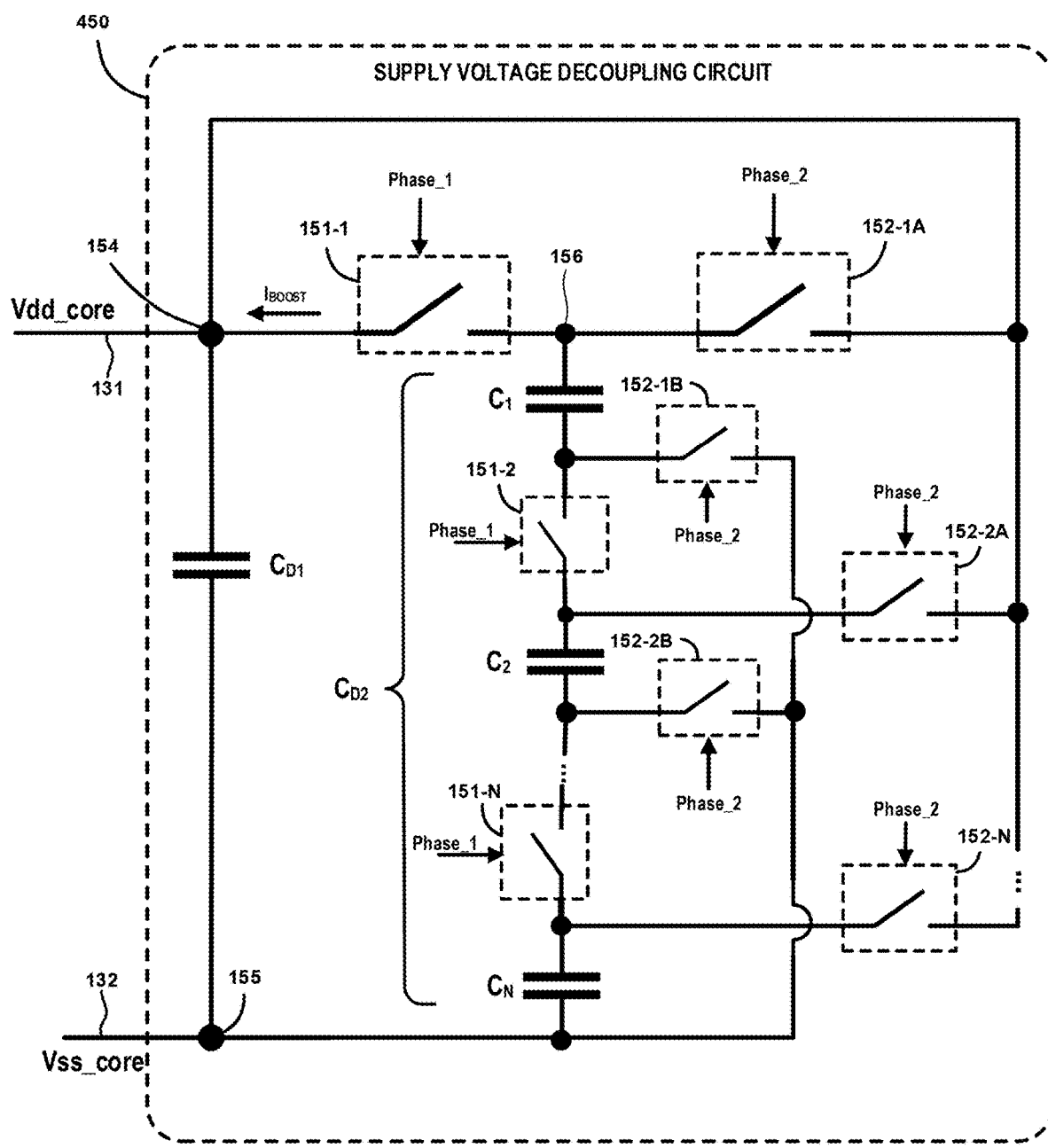
FIG. 7 schematically illustrates a supply voltage decoupling circuit which is configured to minimize supply voltage droop, according to another exemplary embodiment of the invention.

FIG. 7 schematically illustrates a supply voltage decoupling circuit which is configured to minimize supply voltage droop, according to another exemplary embodiment of the invention. In particular, FIG. 7 schematically illustrates an alternate embodiment of a supply voltage decoupling circuit 450 which comprises a set of first switches 151-1, 151-2, . . . , 151-N, and a set of second switches 152-1A, 152-1B, 152-2A, 152-2B, . . . , 152-N. The set of first switches 151-1, 151-2, . . . , 151-N are commonly controlled by the Phase_1 switch control signal, and the set of second switches 152-1A, 152-1B, 152-2A, 152-2B, . . . , 152-N are commonly controlled by the Phase_2 switch control signal.

In the exemplary circuit configuration shown in FIG. 7, when the Phase_2 switch control signal is asserted during a pre-charge phase, each of the second switches 152-1A, 152-1B, 152-2A, 152-2B, . . . , 152-N are activated which causes each of the constituent decoupling capacitors $C_1$, $C_2$, . . . , $C_N$ of the second decoupling capacitor $C_{D2}$ to be connected between the Vdd_core supply node 154 and the Vss_core supply node 155. In particular, the first capacitor $C_1$ is independently connected to the Vdd_core and Vss_core supply nodes 154 and 155 by activation of the switches 152-1A and 152-1B, the second capacitor $C_2$ is independently connected to the Vdd_core and Vss_core supply nodes 154 and 155 by activation of the switches 152-2A and 152-2B, and the Nth capacitor CN is independently connected to the Vdd_core and Vss_core supply nodes 154 and 155 by activation of the switch 152-N. During the pre-charge phase, the Phase_1 switch control signal is de-asserted, such that the first switches 151-1, 151-2, . . . , 151-N are deactivated. Accordingly, during the pre-charge phase, each of the constituent decoupling capacitors $C_1$, $C_2$, . . . , $C_N$ of the second decoupling capacitor $C_{D2}$ are individually charged to a voltage level equal to Vdd–Vss (e.g., Vdd, assuming Vss is 0V).

During the voltage boosting phase, the Phase_2 switch control signal is de-asserted causing the set of second switches 152-1A, 152-1B, 152-2A, 152-2B, . . . , 152-N to be deactivated, and the Phase_1 switch control signal is asserted causing the set of first switches 151-1, 151-2, . . . , 151-N to be activated. As a result of this switching event, the constituent decoupling capacitors $C_1$, $C_2$, . . . , $C_N$ of the second decoupling capacitor $C_{D2}$ are serially connected which causes the voltage level at the internal voltage boosting node 156 to increase from Vdd to N×Vdd, and which causes the voltage boosting node 156 to be connected to the Vdd_core voltage node 154. As a result, the second decoupling capacitor $C_{D2}$ is discharged to source additional boosting current $I_{Boost}$ to the Vdd_core supply line 131 to prevent or minimize supply voltage droop.

It is to be appreciated that the switch configuration of the exemplary supply voltage decoupling circuit 450 as shown in FIG. 7 eliminates the need for an on-chip voltage booster circuit 153 (as compared to the exemplary embodiment of the supply voltage decoupling circuit 150 shown in FIG. 1), while allowing the supply voltage decoupling circuit 450 to generate a boosted voltage (e.g., N×Vdd) using the voltage level at the internal Vss_core supply node 154. The Phase_1 and Phase_2 switch control signals as shown in FIG. 7 can be generated using the same or similar control circuits and methods as discussed above in conjunction with FIGS. 2A, 2B, and 3.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

We claim:

1. A device, comprising:
a supply voltage decoupling circuit comprising:
a first node configured for connection to a positive power supply line of a power distribution network, a second node configured for connection to a negative power supply line of the power distribution network, and a third node;
a first decoupling capacitor connected between the first and second nodes, wherein the first decoupling capacitor is configured to be charged to a first voltage equal to a difference between voltages on the positive and negative power supply lines; and
a second decoupling capacitor connected between the third node and the second node, wherein the second decoupling capacitor is configured to be charged to a second voltage which is greater than the first voltage;

wherein the supply voltage decoupling circuit is configured to operate in a pre-charge mode in which the third node is selectively connected to a voltage source to charge the second decoupling capacitor to the second voltage; and wherein the supply voltage decoupling circuit is configured to operate in a voltage boosting mode in which the third node is selectively connected to the first node to source boosting current to the positive power supply line through discharging of the second decoupling capacitor.

2. The device of claim 1, wherein the voltage source to charge the second decoupling capacitor to the second voltage comprises a voltage booster circuit, wherein the voltage booster circuit comprises a first input terminal connected to the first node, a second input terminal connected to the second node, and an output terminal connected to the third node, wherein the voltage booster circuit is configured to convert a DC level of the first voltage to a higher DC level of the second voltage.

3. The device of claim 2, wherein the device comprises a semiconductor integrated circuit die, wherein the semiconductor integrated circuit die comprises the power distribution network, the supply voltage decoupling circuit, and the voltage booster circuit.

4. The device of claim 1, wherein the second decoupling capacitor comprises a plurality of capacitors which are serially connected between the third node and the second node.

5. The device of claim 4, wherein the plurality of capacitors include N capacitors, wherein each capacitor has a same capacitance value, and wherein the second voltage has a magnitude which is about N times a magnitude of the first voltage.

6. The device of claim 1, further comprising control circuitry configured to switch operational modes of the supply voltage decoupling circuit between the pre-charge and the voltage boosting modes.

7. The device of claim 6, wherein the control circuitry comprises a droop detection control circuit which is configured to (i) monitor the first voltage to detect a droop event in which the first voltage decreases to a level which is at or below a droop threshold voltage level, and (ii) switch the supply voltage decoupling circuit into the voltage boosting mode in response to detecting a droop event.

8. The device of claim 6, wherein the control circuitry comprises a droop prediction control circuit which is configured to (i) predict an occurrence of a droop event in which the first voltage decreases to a level which is at or below a droop threshold voltage level and (ii) switch the supply voltage decoupling circuit into the voltage boosting mode in response to predicting the occurrence of a droop event.

9. The device of claim 6, wherein the supply voltage decoupling circuit comprises:

a first switch connected between the first node and the third node; and a second switch connected between the third node and a fourth node, wherein the fourth node is connected to the voltage source;

wherein the control circuitry generates a first switch control signal to control the first switch and generates a second switch control signal to control the second switch;

wherein during the pre-charge mode, the control circuitry (i) de-asserts the first switch control signal to de-activate the first switch and (ii) asserts the second switch control signal to activate the second switch; and wherein during the voltage boosting mode, the control circuitry (i) asserts the first switch control signal to activate the first switch and (ii) de-asserts the second switch control signal to de-activate the second switch.

10. The device of claim 9, wherein the supply voltage decoupling circuit comprises a voltage booster circuit having an output terminal connected to the fourth node, wherein the voltage booster circuit is configured to convert a DC level of the first voltage to a higher DC level of the second voltage.

11. The device of claim 9, wherein the fourth node of the supply voltage decoupling circuit is connected to an external voltage source.

12. The device of claim 6, wherein the second decoupling capacitor comprises a plurality of capacitors which are configured to be serially connected between the third node and the second node, and wherein the supply voltage decoupling circuit comprises:

a set of first switches; and a set of second switches;

wherein the control circuitry generates a first switch control signal to commonly control the set of first switches and generates a second switch control signal to commonly control the set of second switches;

wherein during the pre-charge mode, the control circuitry (i) de-asserts the first switch control signal to de-activate the set of first switches and (ii) asserts the second switch control signal to activate the set of second switches, to thereby decouple the serially connected capacitors from each other and independently connect each capacitor between the first and second nodes to individually charge each capacitor to the first voltage; and wherein during the voltage boosting mode, the control circuitry (i) asserts the first switch control signal to activate the set of first switches and (ii) de-asserts the second switch control signal to de-activate the set of second switches, and thereby serially connect the plurality of capacitors in series between the third node and the second node to generate the second voltage on the third node as a sum of the first voltages of the serially connected capacitors, and connect the third node to the first node to source the boosting current to the positive power supply line through discharging of the serially connected capacitors of the second decoupling capacitor.

13. The device of claim 12, wherein the plurality of capacitors include N capacitors, wherein each capacitor has a same capacitance value, and wherein the second voltage has a magnitude which is no more than about N times a magnitude of the first voltage.

14. The device of claim 1, wherein the first decoupling capacitor is disposed on a first semiconductor integrated circuit die, and wherein the second decoupling capacitor is disposed on a second semiconductor integrated circuit die.

15. A method, comprising:

capacitively decoupling a power supply line of a power distribution network using a first decoupling capacitor which is connected to the power supply line and charged to a first voltage level of the power supply line, to mitigate voltage droop on the power supply line when the first voltage level does not decrease to a level which is at or below a droop threshold voltage level;

pre-charging a second decoupling capacitor to a second voltage level which is greater than the first voltage level;

determining an occurrence of a droop event in which the first voltage level decreases to a level which is at or below a droop threshold voltage level; and selectively connecting the pre-charged second decoupling capacitor to the power supply line in response to determining the occurrence of the droop event, to thereby apply the second voltage level to the power supply line and source boosting current to the power supply line through discharging of the second decoupling capacitor.

16. The method of claim 15, wherein selectively connecting the pre-charged second decoupling capacitor comprises connecting the first and second decoupling capacitors in parallel to capacitively decouple the power supply line.

17. The method of claim 15, wherein determining the occurrence of the droop event comprises monitoring the first voltage level to detect an actual droop event in which the first voltage decreases to a level which is at or below a droop threshold voltage level.

18. The method of claim 15, wherein determining the occurrence of the droop event comprises predicting an occurrence of a droop event in which the first voltage may decrease to a level which is at or below a droop threshold voltage level based on one or more of (i) operating conditions and (ii) notification signals generated by a functional circuit bloc that is powered by the first voltage of the power supply line.

19. The method of claim 15, wherein pre-charging the second decoupling capacitor to a second voltage level which is greater than the first voltage level comprises:

deactivating a first switch to thereby disconnect the second decoupling capacitor from the power supply line; and activating a second switch to thereby connect the second decoupling capacitor to a boosted voltage source.

20. The method of claim 19, wherein selectively connecting the pre-charged second decoupling capacitor to the power supply line comprises:

deactivating the second switch to thereby disconnect the second decoupling capacitor from the boosted voltage source; and activating the first switch to thereby connect the second decoupling capacitor to the power supply line and connect the first and second decoupling capacitors in parallel.

* * * * *